United States Patent [19]

de Chambost et al.

[11] Patent Number: 4,492,870
[45] Date of Patent: Jan. 8, 1985

[54] ANGULAR LIMITATION DEVICE IN A CHARGED PARTICLE BEAM SYSTEM

[75] Inventors: Emmanuel de Chambost; Jacques Trotel, both of Paris, France

[73] Assignee: Thomson-CSF, Paris, France

[21] Appl. No.: 413,524

[22] Filed: Aug. 31, 1982

[30] Foreign Application Priority Data

Sep. 22, 1981 [FR] France ................................ 81 17846

[51] Int. Cl.³ ............................. H01J 37; A61K 27/02
[52] U.S. Cl. .................................. 250/398; 250/396 R
[58] Field of Search ....................... 250/396, 398, 492.2

[56] References Cited

U.S. PATENT DOCUMENTS

| 4,182,958 | 1/1980 | Goto et al. | 250/492.2 |
| 4,199,689 | 4/1980 | Takigawa | 250/492.2 |
| 4,218,621 | 8/1980 | Nakasuji et al. | 250/492.2 |
| 4,243,866 | 1/1981 | Pfeiffer et al. | 250/492.9 |
| 4,282,437 | 8/1981 | Boie | 250/398 |

FOREIGN PATENT DOCUMENTS 1544222  4/1979  United Kingdom .

OTHER PUBLICATIONS

Electronics International, vol. 50, No. 10, May 1977, by: Chang et al, "Electron-Beam Lithography Draws a Finer Line" pp. 89-98.

Primary Examiner—Bruce C. Anderson
Attorney, Agent, or Firm—Oblon, Fisher, Spivak, McClelland & Maier

[57] ABSTRACT

The device according to the invention comprises a source and an electronic optical system permitting the projection of the beam onto a target plane. According to the invention, a diaphragm for the angular limitation of the beam is positioned between the source and the electronic optical system, the useful current of the beam at the target plane being more than one thousandth of the current emitted by the source.

7 Claims, 4 Drawing Figures

ANGULAR LIMITATION DEVICE IN A CHARGED PARTICLE BEAM SYSTEM

BACKGROUND OF THE INVENTION

The present invention relates to a device for limiting the angular aperture in a charged particle beam system. The invention relates to a charged particle beam system for use in the production of configurations of large scale integrated circuits. The term "charged particles" used up to now designates electrons and ions. In the following description, the invention is described as using an electron beam, but this clearly is in no way limitative.

Electron beam columns have been largely developed for use in systems permitting the microproduction of large scale, integrated, semiconductor circuits. These columns are particularly useful for the inscription of selected configurations on semiconductor pellets. The function of these systems is to make a given configuration on a given area with a specified charge density and an appropriate marginal resolution. In addition, this must take place at the maximum speed.

With respect to the requirements indicated hereinbefore, various electron beam lithographic systems have been developed and used. The conventional electron beam system used for the microproduction of integrated circuits can comprise an electron beam source, condensing lenses, alignment stages, reduction lens stages, a projection lens, a deflection unit and a target area, all arranged in per se known manner.

Compared with photon lithography systems, electron beam systems have the advantage of a smaller diffraction, due to their much smaller wavelength, so that they make it possible to overcome abberations due to diffraction. However, the quality of such systems is not only dependent on the wavelength of the electrons, but also on the abberations from which they may suffer. These abberations can exist for a certain number of reasons and can in particular be mechanical abberations due to symmetry defects in the production of the mechanical parts. They may also be geometrical abberations due to the very geometry of the system, for example a spherical abberation is due to the fact that magnetic lenses are more convergent at the periphery than at their centre. This spherical abberation is proportional to the cube of the angular aperture.

Finally, in systems where the electron current is very high, there can be coulomb abberations, which increase in magnitude with the level of the electric beam current. They may consist of space charge phenomena or interactions between two electrons occurring within the beam or interference electric fields resulting from electron charges accumulated on insulants which can be, for example, condensed thin layers contaminating the conductor materials.

BRIEF SUMMARY OF THE INVENTION

The device according to the invention has the advantage of limiting the beam current as from the start of the electron path, so that there is a maximum reduction of the electric charge effects. In addition, this device permits a mechanical simplification of the system by replacing several diaphragms by a single diaphragm. It also makes it possible to simplify the alignment procedure of the electron beam in the column.

The present invention therefore relates to an angular limitation device in a charged particle beam system incorporating a source and an electronic optical system permitting the projection of the beam onto a target plane, wherein a diaphragm for the angular limitation of the beam is positioned between the source and the electronic optical system, the useful current of the beam at the target plane being greater than a thousandth part of a current from the source.

BRIEF DESCRIPTION OF THE DRAWINGS

The invention is described in greater detail hereinafter relative to non-limitative embodiments of the invention and the attached drawings, wherein show.

DETAILED DESCRIPTION OF THE PREFERRED EMBODIMENTS

In electron optical systems used for focusing an electron beam on a target plane $P_4$, the electron beam at the target plane $P_4$ is defined by its cross-section and angular aperture. As a function of the systems, the cross-section of the beam is the image of the source or stencils of different shapes positioned in planes conjugate with the plane of the sample.

The aperture of the beam is limited by diaphragms placed at a certain distance from the planes conjugate of the plane of the sample. The significance of limiting the aperture $\alpha$ of the beam is to reduce the geometry abberations occurring in the objective and in the beam deflection system. Among these abberations, the spherical abberation is proportional to $\alpha^3$, the coma to $\alpha^2$, the field curvature and the astigmatism to $\alpha$.

Figure 1:
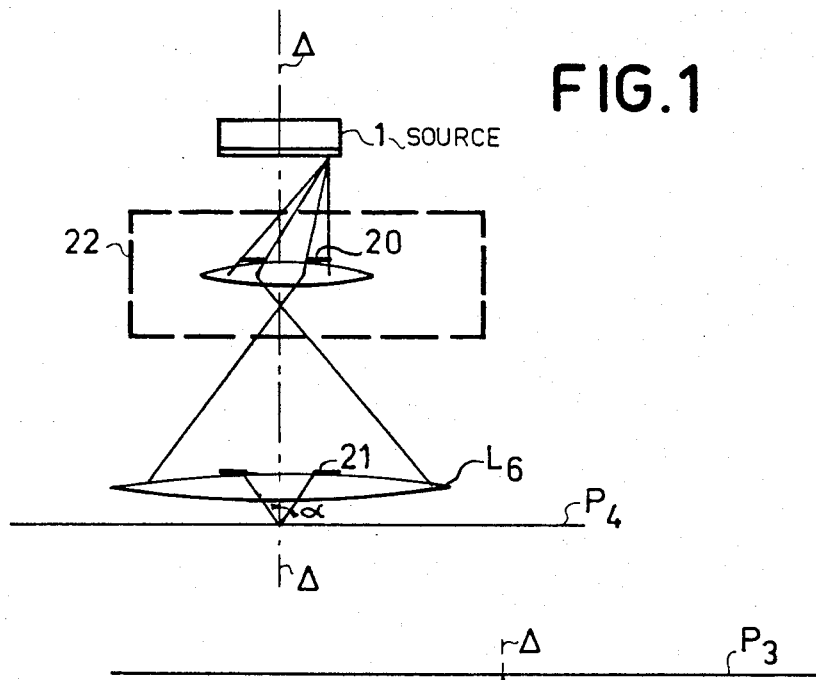
FIGS. 1 to 3 prior art devices.

In FIG. 1, device 22 makes it possible to reduce with one or more lenses the narrower cross-section between the electron beam and source 1, called the crossover. A beam limiting diaphragm 20 is placed within the said device. Lens $L_6$ is the objective permitting the focusing of the beam on the target plane $P_4$. The diaphragm 21 is the final beam limiting diaphragm and constitutes the preponderant diaphragm. The function of this diaphragm is to reduce the geometrical abberations, unlike the other diaphragms which permit space charge effects by limiting the intensity of the beam.

Thus, when several diaphragms limit the angular aperture of a beam, only one is preponderant and in FIG. 1 it is diaphragm 21. The non-preponderant diaphragms located in front of the preponderant diaphragm in the electron path serve to limit the beam current before the preponderant diaphragm in order to reduce electric charge effects.

Figure 2:
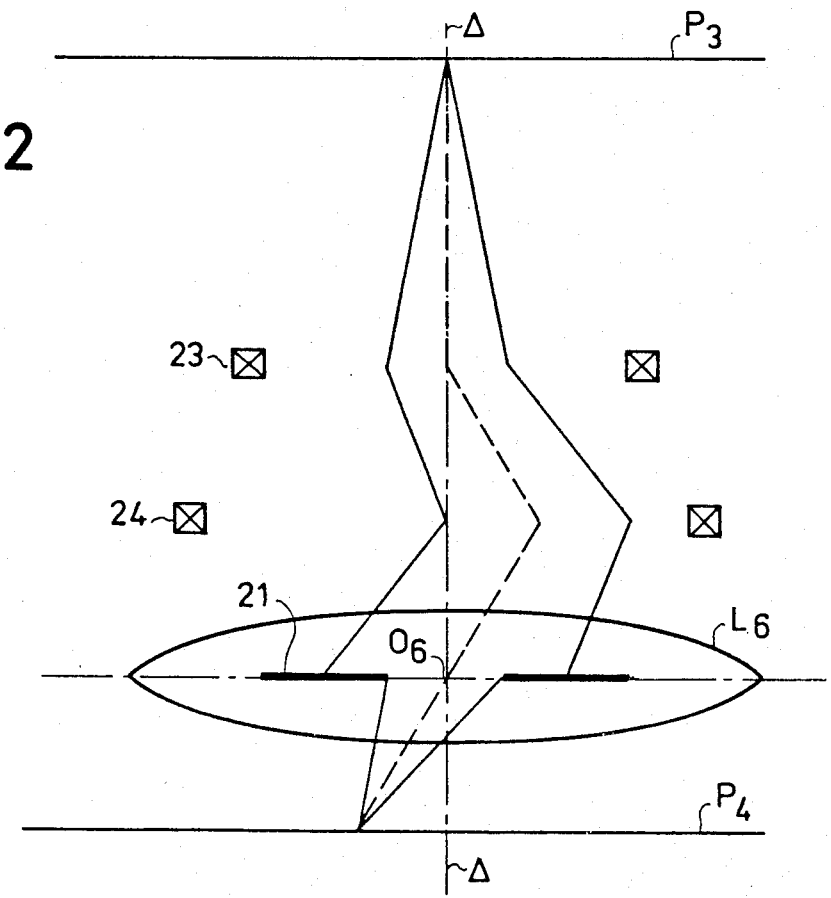

According to the prior art, preponderant diaphragm 21 is placed in the optical centre $O_6$ of objective $L_6$ in the case where a double deflection pivots the beam at the optical centre $O_6$ and as shown in FIG. 2. Thus, the double deflection of the beam is carried out by two deflectors 23, 24 and $P_3$ represents the final plane conjugate with the target plane $P_4$.

Figure 3:
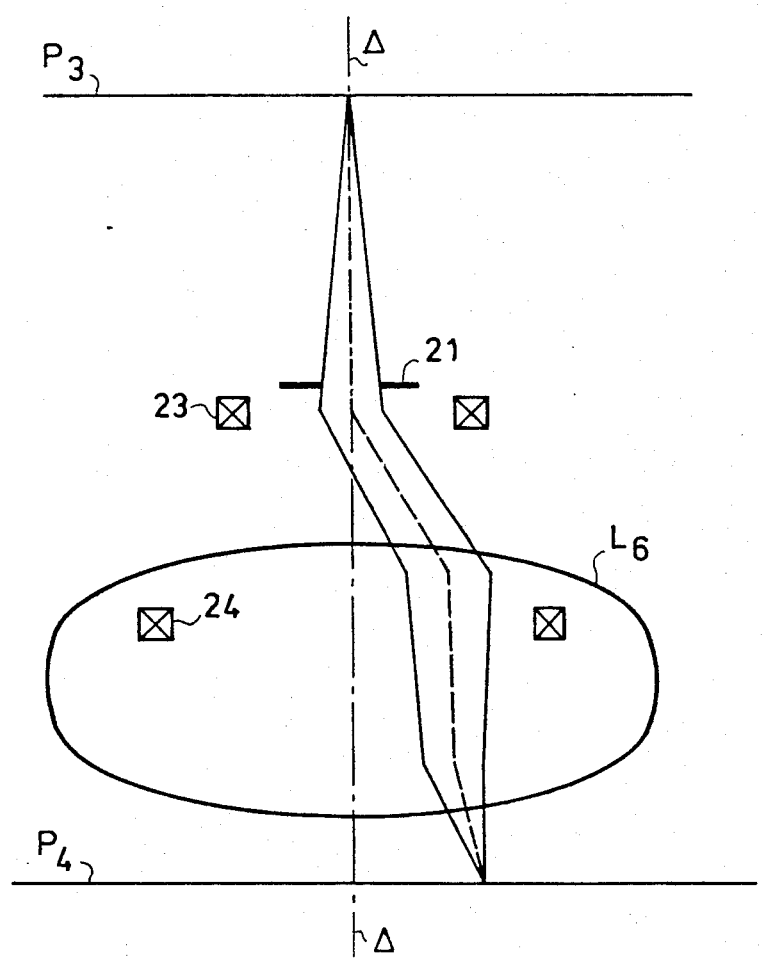

In the case where the deflection system does not force the beam to pivot at the optical centre, the final diaphragm constituted by the preponderant diaphragm 21 can be positioned in front of the deflector, as shown in FIG. 3. $P_3$ represents the final plane conjugate with the target plane $P_4$. In this case, lens $L_6$ is generally thicker, as shown in FIG. 3.

Figure 4:
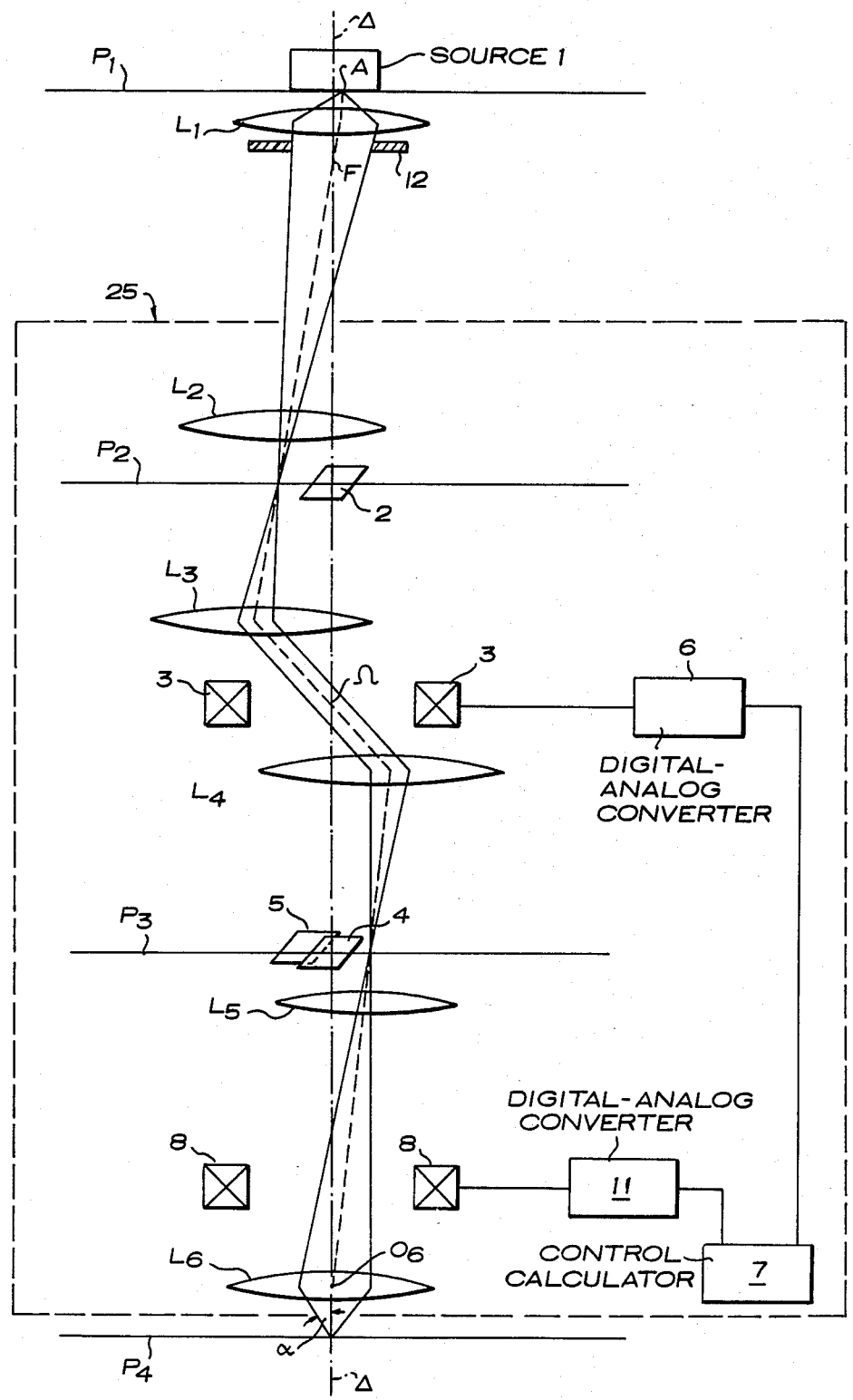
FIG. 4 the device according to the invention.

In the variable rectangular beam systems recently developed in microlithography or in any system with a beam of defined shape, it is possible to replace all the angular aperture limitation diaphragms by a single diaphragm 12 located between source 1 and the first stencil 2 defining the shape of the beam at target plane $P_4$ and as shown in FIG. 4.

In practice, this can be brought about when the ratio of the sample electronic current to the current from the source is sufficiently high and typically above 1/1000. To explain this restriction, it is necessary to consider the example of an electron scan microscope where the current emitted by the source is approximately 100 microamperes and where a diaphragm positioned beneath the source would limit the current to a value below 1 nanoampere, i.e. a ratio between the two currents below $10^{-5}$. In this case, the diameter $d_f$ of the cross-section of the beam a few centimeters below the source is less than 1 mm, so that the diameter d of the aperture of the diaphragm proving the relationship $d_o = \sqrt{10^{-5}} d_f$ which takes account of the fact that the current passing through a diaphragm is proportional to the cross-section of the aperture of said diaphragm, is less than 3 micrometers and its realisation could prove sufficiently difficult to dismiss this type of solution. However, the production of a diaphragm, whose aperture diameter is 30 micrometers forms part of the prior art. Thus, the invention is more particularly applicable to systems where the ratio of the useful current to the emitted current exceeds $10^{-3}$.

FIG. 4 shows an electronic optical system for a rectangular beam comprising a first stencil 2 with a square opening, whose image 5 is formed by lenses $L_3$ and $L_4$, with a magnification of $-1$, on plane $P_3$ of the second stencil 4.

A deflection system 3 makes it possible to displace image 5 relative to the second stencil 4 having a square opening. The intersection of image 5 and stencil 4 defines a variable rectangular cross-section whose reduced image is projected onto a target plane $P_4$ by an objective lens $L_6$. A second deflection system 8 makes it possible to position the composite image of the two stencils in plane $P_4$. Elements 6 and 11 represent two digital-analog converters making it possible to control deflection systems 3 and 8. These two converters are connected to the output of a control computer 7.

Source 1 is, for example, a thermionic source. Lens $L_1$ projects the enlarged image of the narrowest cross-section of the beam at source 1 into plane $P_2$ of the stencil.

Diaphragm 12 is located in the plane of the focus F of lens $L_1$. Limited convergence lens $L_2$ is regulated in such a way that the plane of diaphragm 12 is conjugate with the deflection centre $\Omega$ of deflection system 3. The limited convergence lens $L_5$ is regulated in such a way that the optical centre $O_6$ of lens $L_6$ is conjugate with point $\Omega$.

As the image of diaphragm 12 is formed at optical centre $O_6$ of lens $L_6$, said diaphragm consequently limits the aperture of the beam at target plane $P_4$ in the same way as if a diaphragm with the same dimension as the image of 12 was placed at $O_6$. Furthermore, as points $\Omega$ and $O_6$ are conjugate, when deflection system 3 is operated by system 6 in order to modify the dimensions of the rectangular beam at plane $P_3$, the position of the beam at optical centre $O_6$ remains invariant on the axis of the lens.

FIG. 4 also shows two beams from a point A of the source, off-centered with respect to the axis of symmetry $\Delta$, said beams resting on the edges of diaphragm 12.

What is claimed is:

1. An angular limitation device in a charged particle beam system comprising a source and an electronic optical system permitting the projection of the beam onto a target plane, wherein only a single diaphragm for the angular limitation of the beam is positioned between the source and the electronic optical system, the useful current of the beam at the target plane being more than one thousandth of the current emitted by the source and wherein a first lens is positioned between said source and said diaphragm, said diaphragm being located in the focal plane of said first lens.

2. A device according to claim 1, wherein the electronic optical system comprises an objective lens, which focuses the beam onto the target plane, the image of the diaphragm being formed at the optical centre of said lens.

3. A device according to claim 1, wherein the charged particles are electrons.

4. A device according to claim 1, wherein the electronic optical system comprises a stencil, which eliminates part of the emitted beam, which projects the image of the stencil onto the target plane.

5. A device according to claim 2, wherein the electronic optical system comprises a first object plane in which is materialized a first stencil eliminating part of the beam emitted by said source incorporating a first optical system forming from said stencil, with a predetermined magnification, a real image in the second object plane, the latter containing a second stencil, the real image and the said second stencil forming an image of said stencils, first electrically controlled deflection means being interposed between the first and second object planes so as to displace the real image in the first object plane in a programmed manner and to vary the shape of said image of said stencils, a second optical system being provided for forming the real image of said image of said stencils on the target plane, while second electrically controlled deflection means are provided for displacing the real image on the target plane.

6. A device according to claim 1, wherein the charged particle beam system is an electron beam microlithography system.

7. An angular limitation device in a charged particle beam system, comprising:
   a source of charged particles;
   a first lens;
   a single diaphragm located in the focal plane of said first lens and on the other side of said first lens from said source;
   a target plane for receiving said charged particle beam;
   an electronic optical system including an objective lens for focusing said beam onto said target plane, a first and a second stencil for shaping said beam, a second, third, fourth and fifth lens and a first and second electrically controlled deflection means;
   wherein said second lens focusses said beam in a first object plane containing said first stencil, said third lens, said first electrically controlled deflection means and said fourth lens projecting said beam onto a second object plane containing said second stencil and said fifth lens and said second electrically controlled deflection means projecting said beam onto said objective lens;
   the useful current of the beam at the target plane being more than one thousandth of the current at the source.

* * * * *